United States Patent
Blackwell et al.

(10) Patent No.: US 6,337,004 B1
(45) Date of Patent: Jan. 8, 2002

(54) HIGH ADHESION PERFORMANCE ROLL SPUTTERED STRIKE LAYER

(75) Inventors: Kim Joseph Blackwell, Owego; Pei Cheh Chen, Endicott; Frank Daniel Egitto, Binghamton; Allan Robert Knoll, Endicott, all of NY (US); George Joseph Matarese, Poyntelle, PA (US); Luis Jesus Matienzo, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/431,203

(22) Filed: Apr. 28, 1995

Related U.S. Application Data

(62) Division of application No. 07/695,883, filed on May 6, 1991, now Pat. No. 5,461,203.

(51) Int. Cl.[7] ............................................. C23C 14/34
(52) U.S. Cl. ........................... 204/298.24; 204/298.24
(58) Field of Search ................. 204/192.14, 192.15, 204/192.3, 192.36, 298.23, 298.24, 298.25, 298.26, 298.28; 427/250, 296, 322, 536; 205/165, 167, 169; 156/40, 41

(56) References Cited

U.S. PATENT DOCUMENTS

| | | | | |
|---|---|---|---|---|
| 4,322,276 A | * | 3/1982 | Meckel et al. | 204/298.24 |
| 4,395,313 A | * | 7/1983 | Lindsay et al. | 427/250 |
| 4,455,207 A | * | 6/1984 | Sartor et al. | 204/192.14 |
| 4,693,803 A | * | 9/1987 | Casey et al. | 204/298.24 |
| 4,720,401 A | * | 1/1988 | Ho et al. | 204/192.14 |
| 4,863,808 A | * | 9/1989 | Sallo | 204/192.14 |
| 5,112,462 A | * | 5/1992 | Swisher | 204/192.14 |

* cited by examiner

*Primary Examiner*—Rodney G. McDonald
(74) *Attorney, Agent, or Firm*—Lawrence R. Fraley; Bernard Tiegerman

(57) ABSTRACT

The adhesion of chromium-copper layer to polyimide has been greatly improved by a method which provides controlled reduction, rather than total elimination, of water content in the polyimide. The electronic packaging device which incorporates the flexible circuit prepared by the method exhibits greatly improved reliability. It is believed that the invention can be used to improve the adhesion between other organic materials having moisture affinity and materials comprising in-organics or between two organic materials.

1 Claim, 3 Drawing Sheets

HIGH ADHESION PERFORMANCE ROLL SPUTTERED STRIKE LAYER

This is a divisional of application: Ser. No. 07/695,883 filed on May 6, 1991 now U.S. Pat. No. 5,461,203.

BACKGROUND OF THE INVENTION

1. Field of the Invention

This invention relates to a method of controlling the interfacial adhesion between a metal or alloy and an organic material, and to a structure produced thereby.

More particularly, this invention relates to a method of controlling the interfacial adhesion between one material, such as a metal or alloy, and another material, such as an organic material which has an affinity for absorbing water, water vapor or for absorbing or being degraded at the surface by any other fluid or solvent, and the coherent product formed thereby.

Most particularly, this invention relates to a method for improving the interfacial adhesion between a metal or alloy, particularly a film comprising chromium or chromium overlaid with copper, and a film comprising polyimide (PI). It also improves the polymer-to-polymer bond in a laminate structure. This invention relates also to the product formed as a result of the method, and the machine by which the product is produced.

The method, product and machine of the invention are particularly useful in the electronic packaging art, wherein polyimide films and coatings have potential as a flexible dielectric carrier, on which is disposed conductive circuitry, on which are in turn optionally disposed one or more of intergrated circuit chips and/or surface mounted components.

2. Background Art

Certain organic materials, particularly certain polyimides, are promising from many points of view for use as flexible film insulative carriers in electronic packaging applications such as, for example, in flexible and Tape Automated Bonding (TAB) configurations. Being flexible, polyimide is easy to handle and its coefficient of thermal expansion (CTE) is close to that of silicon, a fact which is convenient when connection is made between electronic chips and polyimide carriers. The coefficient of linear expansion of polyimide ($2 \times 10^{-5}$ in/in degree C) is one of the best among polymers supplied in a roll format. Other properties of PI that make it useful for the electronics industry are its dielectric strength (5,400 volts/0.001 inch typical for 0.002 inch thick), its dissipation factor (0.0025 for 0.002 inch thick), its volume resistivity ($8 \times 10^{15}$ ohm meters for 0.002 inch thick and 125 volts). However, the affinity of polyimide to absorb moisture creates a number of difficulties involved in its use, such as unreliable short and/or long-term adhesion between the polyimide and the conductive lines disposed thereon.

In the short term, additional processing steps subsequent to the initial deposition of metal-on-polyimide, such as steps related to additive electroplating, expose the polyimide to chemical solutions and solvents which are absorbed by the polyimide and provide a cause for lifting of the conductive lines. In the long term, a failure in the line adhesion due to temperature and humidity effects on a working device is intolerable in the high performance computer systems of the future, for which absolute reliability is necessary. Whereas the flexible film carrier with surface mounted chip or other device is a configuration which reduces problems due to thermal mismatch between the chip and the support on which the chip is mounted, the problem of adhesion between the metal and non-metal portions of the carrier has not been fully resolved.

It is known that polyimide absorbs about 3–4% by weight of water. However, exposure to water is unavoidable, as water is used in cleaning dust and debris as is caused by mechanical punching. Exposure to a humid working environment cannot always be avoided. In addition, the polyimide is exposed to water solutions of electrolytes in the additive plating process. When polyimide is exposed to an electrolyte, conductive ions from the solution are absorbed with solute, damaging the dielectric properties as well as the adhesive capability of the polyimide.

In U.S. Pat. No. 4,863,808 issued Sep. 5, 1989 to Sallo, the vacuum deposition of chromium as a barrier layer between copper and polyimide is described as affording resistance to undercutting by subsequent gold and tin plating baths. Applicants have found that the use of a chromium layer is not alone sufficient protection for polyimide.

Studies have proposed the role of carbonyl formation on adhesion promotion between metal and polyimide. There are basically two interpretations of the interaction between polyimide and a metal atom.

In the first approach, described in the IBM Journal of Research and Development, 32,658 (1988), by Ho et al., the formation of a charge transfer complex between the incoming metal atoms and the aromatic ring of the PMDA portion of the molecule is proposed. Quantum mechanical calculations suggest that the interaction above described is more important than the chromium-carbonyl group interaction.

In the second proposed interaction, described by Goldberg et al. in the Journal of Vacuum Science Technology, A6, 991 (1988), the authors describe the attack of the first Cr atoms on the PMDA portion of the polyimide structure. As a consequence of such an attack, the first Cr atoms become oxidized while the PMDA portion of the PI molecule becomes reduced to a mono-anion. Interaction of the carbonyl groups with the Cr ion induces formation of Cr—O bonds. The first interaction involves a Cr ion with two carbonyl groups from different chains. Additional Cr deposition leads to formation of more Cr—O and Cr—N bonds.

The latter explanation applies to other metal/PI interactions besides Cr/PI. With an increased population of carbonyl groups, much greater interaction and better adhesion strength is expected at the metal/PI interface. This is why carbonyl group enhancement via oxygen plasma treatment may be expected to affect the adhesive quality of material produced.

However, the art neither describes nor suggests that the problem of adhesion between chromium and polyimide is solved by control rather than elimination of the water content of the polyimide, and the art does not describe or suggest the process steps, structure or device of the present invention. The art does not account for the fact that adhesion between metal and organic material does not simply bear a directly proportional relationship to the amount of carbonyl exposure, but actually diminishes beyond an optimum time of exposure.

The present inventors have made the surprising discovery that the removal of all water from the polyimide is neither necessary nor desirable, and that a small residual amount of moisture can actually enhance adhesion between the metal and non-metal to an extent not heretofore seen or expected.

Sputter roll metallizers are known in the art. However, in the systems known in the art, the oxygen DC glow chamber is found at the chill drum section. The sputter roll metallizer of the present invention is set inline apart from the DC glow chamber, allowing increased oxygen pressure.

SUMMARY OF THE INVENTION

It is therefore an object of the invention to provide a flexible film carrier having a controlled degree of adhesion between the polyimide base an d the circuitization layers.

It is a further object of the invention to provide a flexible film carrier having improved short and long-term adhesion between the polyimide base and the circuitization layer s which is superior to that known in the art.

It is a further object of the invention to provide a flexible film carrier with improved imperviousness to moisture whether in gas or liquid form.

The foregoing and other objects and advantages are accomplished in the present invention by means of process steps which include partial outgassing of water from the polyimide carrier at an elevated temperature to a predetermined, near zero level prior to surface treatment with energetic oxygen atoms. The process is performed in situ, optionally either in a vacuum sputter, cooled-roll system or as a panel process. The process leaves detectable "footprints" in the product which can be detected by Ruterford Backscattering (RBS).

DESCRIPTION OF THE PREFERRED EMBODIMENTS

In order to facilitate understanding of the present invention, reference is made to the following detailed description taken in conjunction with the above described tables and figures.

It has been thought that complete removal of water from polyimide is a requirement for providing adhesion between metal and for providing strong polymer-to-polymer bonding, and that once it is completely removed, keeping the water out is a requirement for maintaining adhesion over time. It has also been thought that high temperature treatment is required in order to obtain this result. The present invention includes a process, a device for carrying out the process, and a resulting metallized organic structure in which extremely high values of adhesion, the highest known, are exhibited between the non-metallic and metallic portions of the structure. In order to obtain the enhanced adhesion values it has been surprisingly discovered that it is neither necessary nor desirable to remove all absorbed water from the organic component, described herein as polyimide. In fact, thorough outgassing of all water at high temperature actually results in reduced adhesion over the present method and in heat creasing of the organic component during metallization. Under outgassing conditions which result in reduction of the water absorbed in the polyimide to a level estimated at about 1% to about 2% by weight and under conditions of moderate temperatures adhesion is enhanced. Furthermore, polyimide that is "bad", i.e. varies in its properties, can be made to form an adherent bond to metal reproducibly by means of the present invention.

The examples below are representative of the conditions for which the values in Table I were obtained. Table I is provided below, following these examples.

EXAMPLE 1

Figure 3:
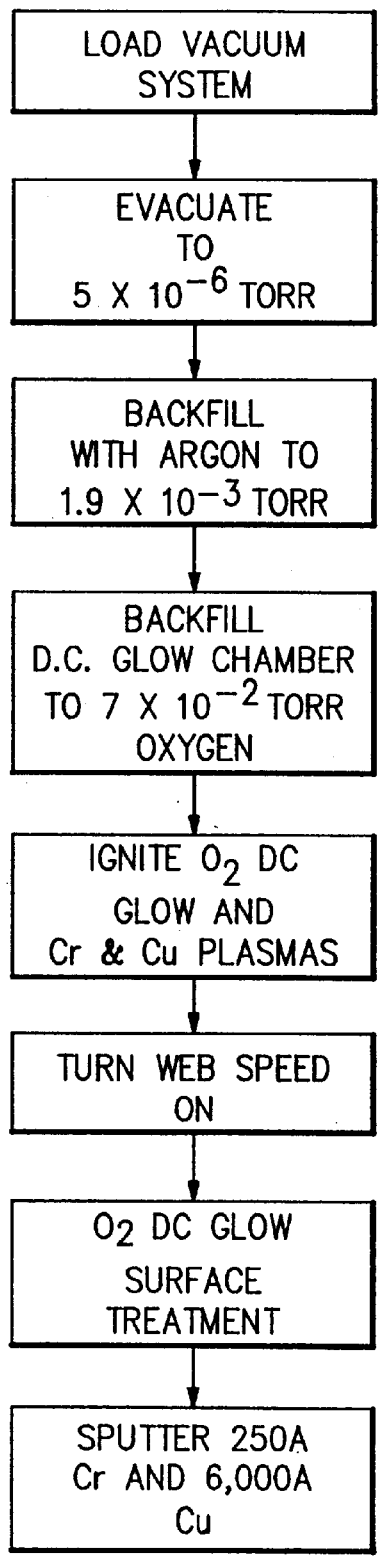
FIG. 3 is a flowchart of the sputter seed process of the invention, so called because the chromium-copper flash provides a continuous metallization for subsequent additive electroplating.
Figure 4:
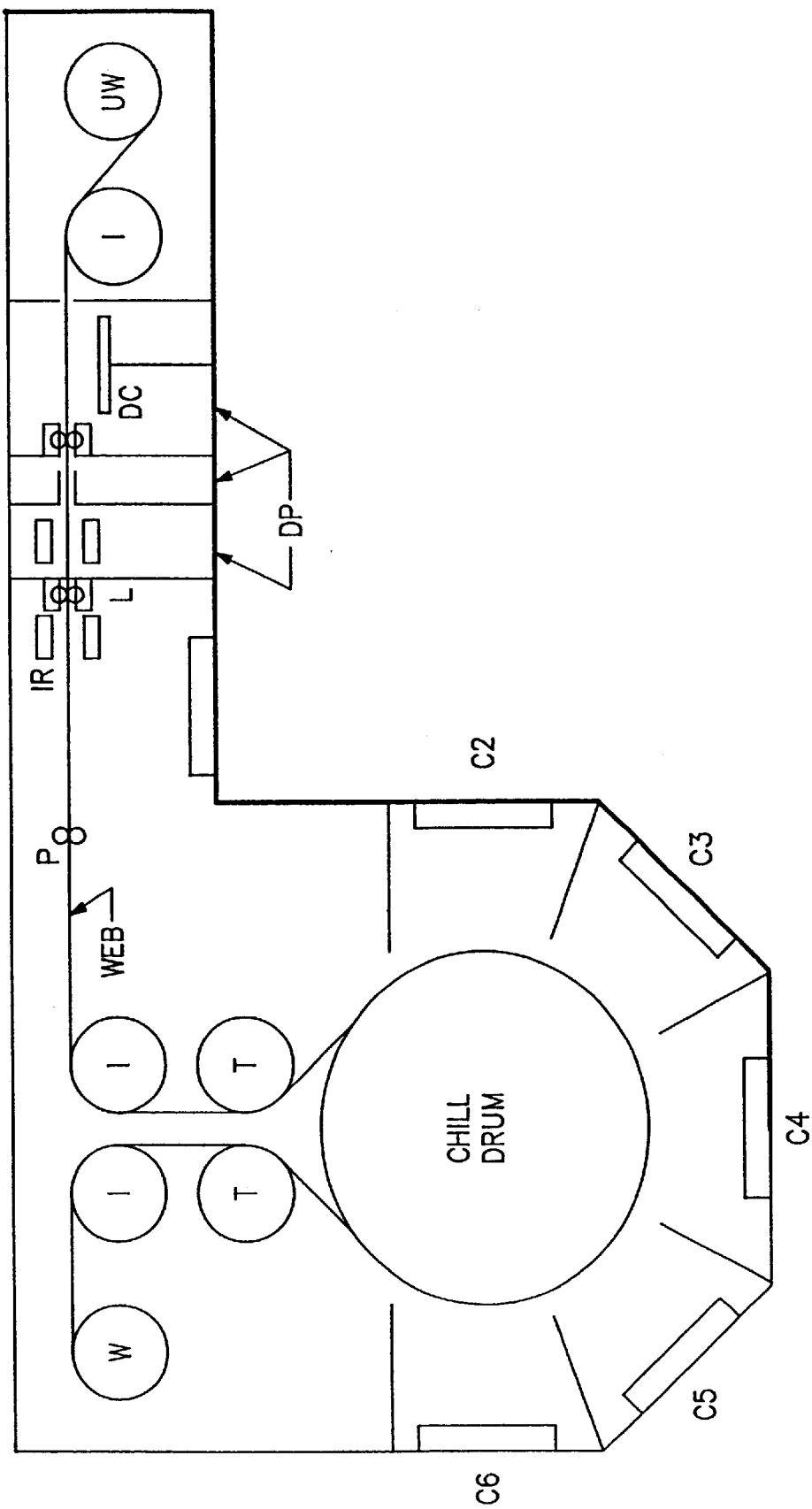
FIG. 4 is a schematic drawing of the sputter roll metallizer of the present invention.

The shiny side of a roll of Dupont Kapton H-film polyimide (a/k/a web) was passed through a vacuum interlock into the vacuum roll sputter system of FIG. 4 at a rate of 400 feet per hour and partially outgassed in vacuum at 250 degrees C for 8 seconds. Unlike the roll metallizers which are commercially available, the roll metallizer of FIG. 4 does not have the oxygen DC glow chamber at the chill drum section. As seen in FIG. 4, the oxygen DC glow chamber of the present invention is characterized by being set similar to an inline configuration. This permits attainment of an oxygen pressure of $70 \times 10^{-3}$ torr. This pressure is about 10 times higher than that of a conventional roll metallizer in which the glow unit is located at the drum. Having the glow discharge at the drum places it in close proximity to the sputter targets which requires that the glow pressure be kept low for minimizing oxygen contamination of the sputtered metals. The 250 degrees C temperature was maintained/monitored. Next the polyimide was sputter coated with a strike layer of about 250 Angstroms chromium followed by a layer of about 6,000 Angstroms sputtered copper. The vacuum was maintained throughout completion of all steps. The overall vacuum process is seen in the flow chart, FIG. 3. The web was electroplated in a commercially available copper electroplating bath up to a thickness of 0.3 mils. Lines were formed subtractively, i.e. by photolithographically coating copper in areas to be protected and dissolving the uncoated copper, and the adhesion of the lines was evaluated by use of the standard 90 degree peel test in conjunction with accelerated environmental stressing in a temperature-and-humidity chamber for 1000 hours at 85 degrees C and 80% relative degrees C and 80% relative humidity, a test commonly used for evaluating adhesion which is deemed to equate to ten years' use in a computer. Five lines were tested in order to obtain the 5.6 g./mm adhesion value seen in Table I, with a standard deviation of less than 5%.

EXAMPLE 2

The same procedure was followed as described in Example 1, except that subsequent to the step of partial outgassing of water from the polyimide web and prior to the step of chromium deposition, the surface of the polyimide web was subjected to energetic oxygen atom treatment at 200 ft./hr. This additional plasma step was performed in situ, without breaking vacuum either before or after the plasma step. The line adhesion measured 61.8 g./mm.

EXAMPLE 3

The same procedure was followed as described in Example 2, except that instead of 250 degrees C the temperature of the heater was maintained at 150 degrees C. The resultant line adhesion measured 43.3 g./mm.

The experiments described in Examples 1–3 show that for a web speed of 400 ft./hr. an oxygen plasma of 200 ft./hr. in combination with a heater temperature above 150 degrees C, in fact at about 250 degrees C, results in greatly improved adhesion of the metal lines to the non-metal carrier which, in the three examples, was 0.3 mil electroplated copper lines over a chrome-copper strike layer on polyimide.

Besides the Kapton H polyimide in the 3 examples, other polyimides which can be used with substantially similar results include Kapton V, UBE Upilex 'S' and 'R', Kanegafuchi Apical 'AV' and Mitsubishi Novax. Dupont H Kapton in 0.005 in. and 002 in. thicknesses and VBE Upilex S in 0.002 inches were tested reproducibly.

The high oxygen atom energy treatment step can be performed by placing the web in an RF plasma, DC glow or Ion Beam for a short time, but the oxygen atoms must be of sufficient energy to effect the chrome-polyimide interaction.

TABLE I

ADHESION VALUES FOR A 0.3 MIL THICK LINE, VALUES IN G/MM, 5 LINES PER VALUE AND STANDARD DEVIATION OF <5%, SHINY SIDE

| 400'/HR. WEB SPEED 250 C. HEATER TEMP. | 400'/HR. WEB SPEED 250 C. HEATER TEMP. 200'/HR. PLASMA | 400'/HR. WEB SPEED 150 C. HEATER TEMP. 200'/HR. PLASMA |
|---|---|---|
| 5.6 | 61.8 | 43.3 |

Figure 1:
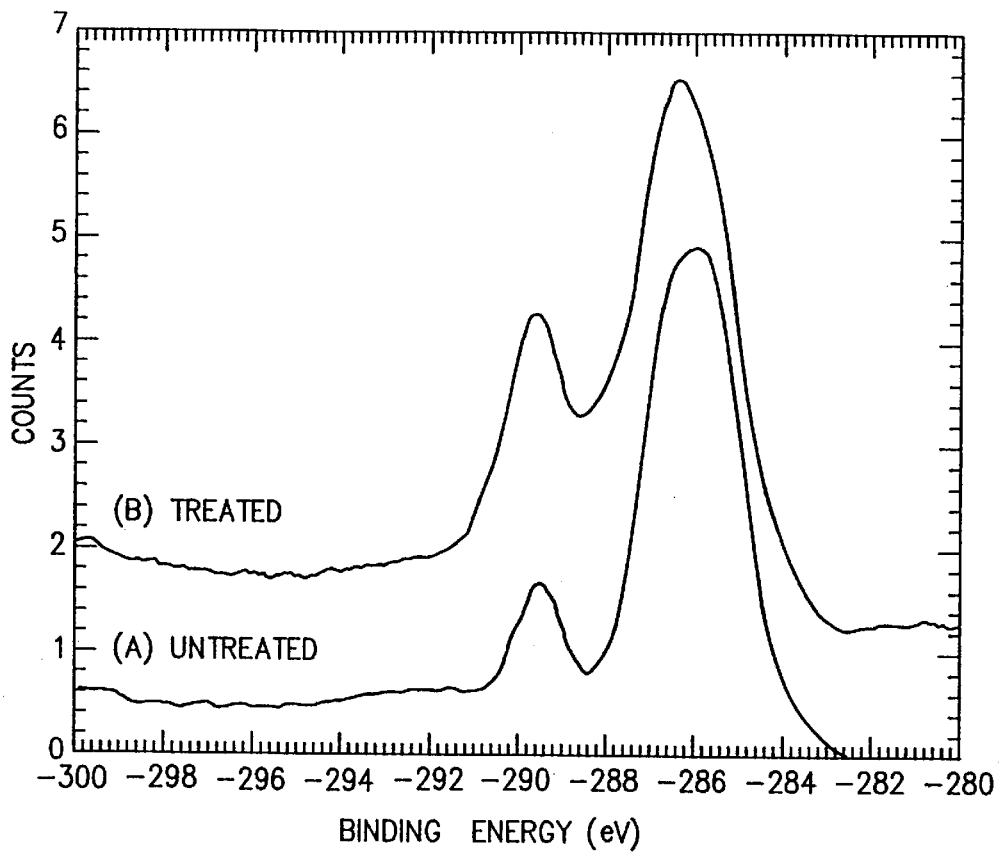
FIG. 1 shows the carbon-1 spectrum (C1S) Electron Spectroscopy for Chemical Analysis (ESCA) from the downstream oxygen microwave plasma process.
Figure 2:
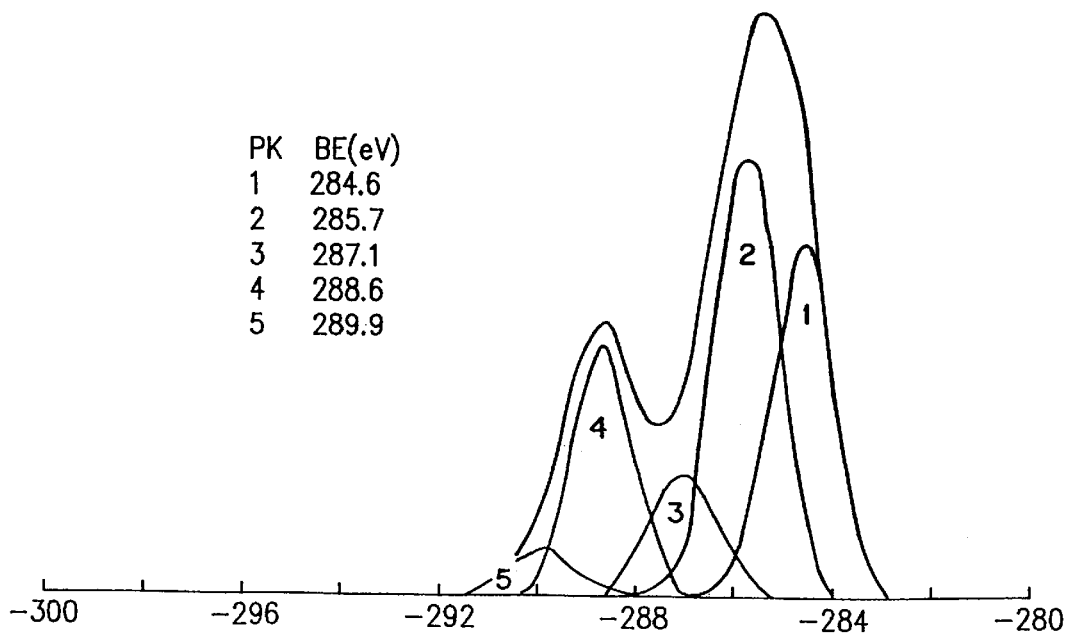
FIG. 2 shows the C1S ESCA from a typical oxygen plasma.

As can be seen in Table II for microwave generated plasma, increasing the treatment time (slower web speed) has a deleterious effect on adhesion values, contrary to what would be expected. Whereas it is known that the downstream plasma process creates oxygen atoms, which cause the formation of carbonyls on the polyimide surface, the art theorized that the improvement in adhesion was directly proportional to the concentration of carbonyls on the polyimide surface. The results in Table II indicate that the direct proportionality is not so beyond a certain point. In addition, the ESCA curves of FIGS. 1 and 2 indicate no difference. In other words, no difference is shown between the ESCA spectrum taken from the downstream microwave plasma process (FIG. 1) and that of the typical oxygen plasma (FIG. 2).

TABLE II

MICROWAVE GENERATED PLASMA LOCATED DOWNSTREAM FROM MATERIAL VALUES ARE IN G/MM FROM A 0.3 MIL THICK Cu LINE

| 25'/HR WEB SPEED | 100'/HR. WEB SPEED | 200'/HR. WEB SPEED | 400'/HR WEB SPEED |
|---|---|---|---|
| 0 | 4 | 13 | 21 |

Table III shows the adhesion values in g./mm at various web speeds, i.e. exposure times, when the Dupont H 712 Kapton is treated with an oxygen DC glow rather than the downstream microwave plasma of Table II. As in Table II the temperature was 250 degrees C and the metal lines 0.3 mils thick. Table III indicates that adhesion increases to a maximum at a specific oxygen treatment time, namely at or about 100 ft./hr., and then decreases. This result is in contrast to the teachings in the art, which would lead one skilled in the art further to increase treatment time in order to maximize adhesion, and supports the high energy specific, controlled dosage times of the present invention.

TABLE III

O2 DC GLOW TREATMENTS WITH 400'/HR, 250° C. OUTGASSING PROCESS VALUES ARE IN G/MM FROM A 0.3 MIL THICK Cu LINE

| 25'/HR WEB SPEED | 100'/HR WEB SPEED | 200'/HR WEB SPEED |
|---|---|---|
| 18.2 | 67.4 | 61.8 |

Table IV shows the adhesion values in g./mm at web speed of 100ft./hr. for Dupont 712 polyimide and 200 ft./hr. for Dupont 713 polyimide, the temperature in both cases being 250 degrees C and the metal lines 0.3 mils thick. A comparison with Table III indicates that the result for Dupont 712 H polyimide is reproducible at 100 ft./hr. and that at 200 ft./hr. Dupont 712 polyimide exhibits adhesion superior to Dupont 713 polyimide at the same oxygen DC glow exposure.

TABLE IV

O2 DC GLOW TREATMENT WITH 400'/HR, 250° C. OUTGASSING PROCESS VALUES ARE IN G/MM FROM A 0.3 MIL THICK Cu LINE

| DUPONT 712 .100'/HR. PLASMA | DUPONT 713 200'/HR. PLASMA |
|---|---|
| 67.4 | 43 |

In all the above examples it is necessary that once the outgassing and plasma steps are complete, Cr and Cu must be sputtered in situ. Breaking vacuum between the plasma and the Cr deposition steps resulted in poor adhesion between the metal and the polyimide; breaking vacuum between the Cr and Cu deposition steps resulted in Cr—to—Cu delamination. The vacuum system used must contain a heater section, a plasma section, and a metal deposition section, It is not necessary that the polyimide be in roll form for the process of the invention to result in the improved adhesion. Likewise, the process is potentially applicable to organic materials other than polyimide and to metal layers other than Cr—Cu—Cu. It is understood that the invention may be embodied in modifications of the present invention forms without departing from the spirit or central characteristics thereof. The aforementioned examples and embodiments are therefore to be considered in all respects as illustrative rather than restrictive, and the invention is not to be limited to the details given herein.

What is claimed is:

1. A roll sputter system comprising an oxygen DC glow chamber and a chill drum section, wherein the oxygen DC glow chamber is positioned inline apart from the chill drum section.

* * * * *